United States Patent [19]
Mikami et al.

[11] Patent Number: 5,275,840
[45] Date of Patent: Jan. 4, 1994

[54] MANUFACTURING METHOD FOR ELECTROLUMINESCENT THIN FILM

[75] Inventors: Akiyoshi Mikami, Mie; Kousuke Terada, Nara, both of Japan

[73] Assignee: Sharp Kabushiki Kaisha, Osaka, Japan

[21] Appl. No.: 861,433

[22] Filed: Apr. 1, 1992

[30] Foreign Application Priority Data
Apr. 1, 1991 [JP] Japan .................. 3-068331

[51] Int. Cl.⁵ .................. B05D 5/06; C23C 16/00
[52] U.S. Cl. .................. 427/66; 427/69; 427/248.1; 427/255.2
[58] Field of Search ............. 427/66, 69, 248.1, 255.2; 118/719, 726

[56] References Cited
FOREIGN PATENT DOCUMENTS

| | | |
|---|---|---|
| 60-47717 | 10/1985 | Japan . |
| 62-145694 | 6/1987 | Japan . |
| 1-289091 | 11/1989 | Japan . |
| 2-152193 | 6/1990 | Japan . |
| 2-140632 | 11/1990 | Japan . |

OTHER PUBLICATIONS

Akiyoshi Mikami et al.; "Chemical Vapor Deposition of a ZnS:Mn Electroluminescent Film in a Low-Pressure Halogen Transport System", Jan. 19, 1990 pp. 61-68.

*Primary Examiner*—Shrive Beck
*Assistant Examiner*—David M. Maiorana

[57] ABSTRACT

In a manufacturing method for an electroluminescent thin film, a base material made of a II-VI group compound semiconductor and a material of an element for an emission center to be included in the base material are provided separately in first and second gas passages provided in a source zone on the upstream side of a reaction tube. The base material is transported to a growth zone on the downstream side thereof through the first gas passage by the use of an inert carrier gas, while the element material is transported through the second gas passage in the form of a halogen compound vapor, so as to grow an electroluminescent thin film on a substrate disposed in the growth zone. A reducing gas is fed to the growth zone through a third gas passage which bypasses the source zone from the upstream side to the downstream side of the reaction tube.

7 Claims, 5 Drawing Sheets

MANUFACTURING METHOD FOR ELECTROLUMINESCENT THIN FILM

BACKGROUND OF THE INVENTION

1. Field of the Invention

The present invention relates generally to a manufacturing method for an electroluminescent thin film, and more particularly, to a method for manufacturing a light emitting layer of an electroluminescent thin film element to be employed for displays of various electronic devices and of measurement instruments, for terminals of computers and of word processors and so on by using the chemical vapor deposition process.

2. Description of the Related Art

As a material for constituting a light emitting layer of an electroluminescent thin film element, it is known that a semiconductor of II-VI group compound such as ZnS, ZnSe, CaS, SrS is employed as a base material and manganese or rare earth ions such as Tb, Sm, Ce and Eu are added thereto as emission center. Among these materials, the only material currently available for practical use is ZnS:Mn wherein ZnS is employed for the base material and Mn is employed as emission center. In order to grow a ZnS:Mn film, the following two kinds of thin film forming techniques are used:

(1) A vacuum deposition process employing the powders of ZnS and Mn or a mixed sintered material thereof as a evaporation source (for example, Japanese Patent Publication 10358/1977); and (2) A chemical vapor deposition (CVD) type atomic layer epitaxy process in which Zn, S and Mn are alternately supplied onto a substrate each in the vapor state so as to grow a film in units of atomic layers (Japanese Patent Publication 57-35,158/1982).

Besides these methods, the following methods are being investigated in order to improve the quality of an electroluminescent thin film and of making an electroluminescent thin film for multi-color displays:

(3) A high frequency sputtering technique employing a mixed target of ZnS and Mn;

(4) An organic metal chemical vapor deposition process (MOCVD method) in which an organic compound of II group metal and a hydroxide of VI group metal are thermally decomposed on a substrate;

(5) A Multi-source vapor deposition process in which solid materials of Zn, S and Mn subjected to overheating are supplied from respective evaporation sources under vacuum; and (6) A halogen transport CVD process in which a hydrogen halide is used as a carrier gas of Mn for emission center.

The applicant of the present invention recently proposed a halogen transport CVD process under low pressure (refer to Japanese Patent laid open Publication 289,091/1989) which is excellent for improving the quality of an electroluminescent film, for enlarging its area and for improving its productivity.

In the halogen transport CVD process, a ZnS source and a metallic Mn source are transported by hydrogen gas (or inert gas) and by hydrogen chloride (HCl) gas, respectively, and a film is grown on a substrate as a result of chemical reaction. A difference of the halogen-transport CVD process at a low pressure from the above-mentioned methods (1) through (5) lies in that the ZnS source gas generated in the source zone (in the upstream side or in a high temperature zone) of the reaction tube is transported to the growth zone (in the downstream side or in a low temperature zone) due to the flow of a carrier gas and the Mn source is transported as a gas of a halogen compound separately. Namely, the ZnS source and Mn source generated according to the following chemical reactions are transported separately to a substrate, so as to grow a film on the substrate due to chemical reaction:

$$ZnS \rightarrow Zn + (\tfrac{1}{2})S_2. \tag{1}$$

$$Mn + 2HCl \rightarrow MnCl_2 + H_2. \tag{2}$$

Therefore, the source gases of high purity can be supplied to the substrate, and a film having a close and strong bonding can be grown. Thus, a high quality electroluminescent thin film is obtained.

In the halogen-transport CVD process at a low pressure, the kinds and flow rates of the carrier gases are important factors which affect the film quality and the device characteristics. For example, HCl gas is employed for transport of the Mn source, while a single gas such as $H_2$ gas or inert gas such as He or Ar is used as the carrier gas of the ZnS source.

As to a practical use of an electroluminescent film, it is demanded to produce an electroluminescent film of better electroluminescent properties with better reproducibility characteristics. In order to obtain better electroluminescent characteristics, it is desired for an electroluminescent film to have a larger concentration of emission center and to have better crystallinity or less crystal defects. The halogen transport CVD process is deficient for these factors.

Accordingly, an object of the present invention is to provide a manufacturing method of an electroluminescent thin film wherein emission center can be doped in a thin film electroluminescent element at a high concentration with good reproducibility characteristics and the crystallinity of a thin film electroluminescent element can be increased to a desirable level.

SUMMARY OF THE INVENTION

In order to achieve the aforementioned object, according to an embodiment of the present invention, there is provided a manufacturing method of an electroluminescent thin film, comprising the steps of: (a) providing first and second gas passages in a source zone located on the upstream side in a reaction tube, and providing a base material made of a II-VI group compound semiconductor in the first gas passage and providing a material made of an element in the second gas passage, said element playing a role as emission center in the base material; (b) providing a third gas passage to bypass the source zone from the upstream side to the downstream side of the reaction tube; (c) transporting the base material through the first gas passage to a growth zone located on the downstream side in the reaction tube with the use of a carrier gas, the carrier gas being made of an inert gas, and transporting the element material in the form of halogen compound vapor through the second gas passage to the growth zone; and (d) feeding a reducing gas to the growth zone through the third gas passage, said reducing gas being able to reduce the halogen compound; and (e) growing an electroluminescent thin film on a substrate provided in the growth zone.

Preferably, the inert gas and the reducing gas are made of He gas and $H_2$ gas, respectively, and the ratio of flow rates of the gases satisfies the following relation:

$$0.01 < F_{H2}/F_{He} < 1.$$

It is an advantage of the present invention that a better quality of an electroluminescent film can be manufactured with good reproducibility characteristics.

BRIEF DESCRIPTION OF THE DRAWINGS

This and other objects and features of the present invention will become clear from the following description taken in conjunction with the preferred embodiments thereof with reference to the accompanying drawings, and in which.

DETAILED DESCRIPTION OF THE PREFERRED EMBODIMENTS

A halogen transport CVD process is provided based on the experiments, analysis and consideration mentioned below.

Table 1 compiles data on the concentration of Mn in a grown film and the X-ray diffraction intensity (indicating the quality of crystallinity) when a ZnS:Mn thin film is grown by using the above-mentioned halogen-transport CVD process (6) with $H_2$ gas and with He or Ar gas as carriers, respectively. In Table 1, the X-ray diffraction intensity is represented by a value relative to the reference value (=1) obtained when $H_2$ carrier gas is used. In the crystal growth, the HCl gas flow rate for Mn source transport is 0.5 cc/min, the carrier gas flow rate for ZnS source is 100 cc/min and the growth temperature of the substrate is 500° C. (constant).

TABLE 1

| carrier gas for ZnS | Mn density (at. %) | X-ray diffraction intensity (relative value) | Mn density reproducibility (%) | Cl/Mn (relative value) | luminance (cd/m²) 1 kHz |
|---|---|---|---|---|---|
| $H_2$ | 0.23 | 1 | ±23 | 0.02 | 3050 |
| He | 0.42 | 0.33 | ±11 | 0.09 | 2270 |
| Ar | 0.45 | 0.31 | ±13 | 0.08 | 2190 |

As is apparent from Table 1, when $H_2$ gas is used as carrier gas for ZnS, the Mn concentration is only 0.23 at %. On the other hand, in the case of He gas, the Mn concentration is increased to 0.42 at %. This shows that the doping of a higher concentration of Mn can be realized under the same Mn transport rate. However, in this case, the crystallinity is decreased to 0.33 as a relative value, which is not desirable from the view-point of luminance. Further, in the case of Ar gas, although the Mn concentration is further increased to 0.45 at %, the crystallinity is decreased as low as in the case of He gas. As described above, each carrier gas has its own advantages and disadvantages, and any gas is not completely satisfactory.

On the other hand, the reproducibility of Mn concentration (a value representing the scattering of concentration with %) compiled in Table 1 is obtained when crystal growth is conducted successively five times. It is a problem in the case of $H_2$ carrier gas that the controllability of Mn concentration is not as good as in the cases of He and Ar carrier gases.

Figure 1:
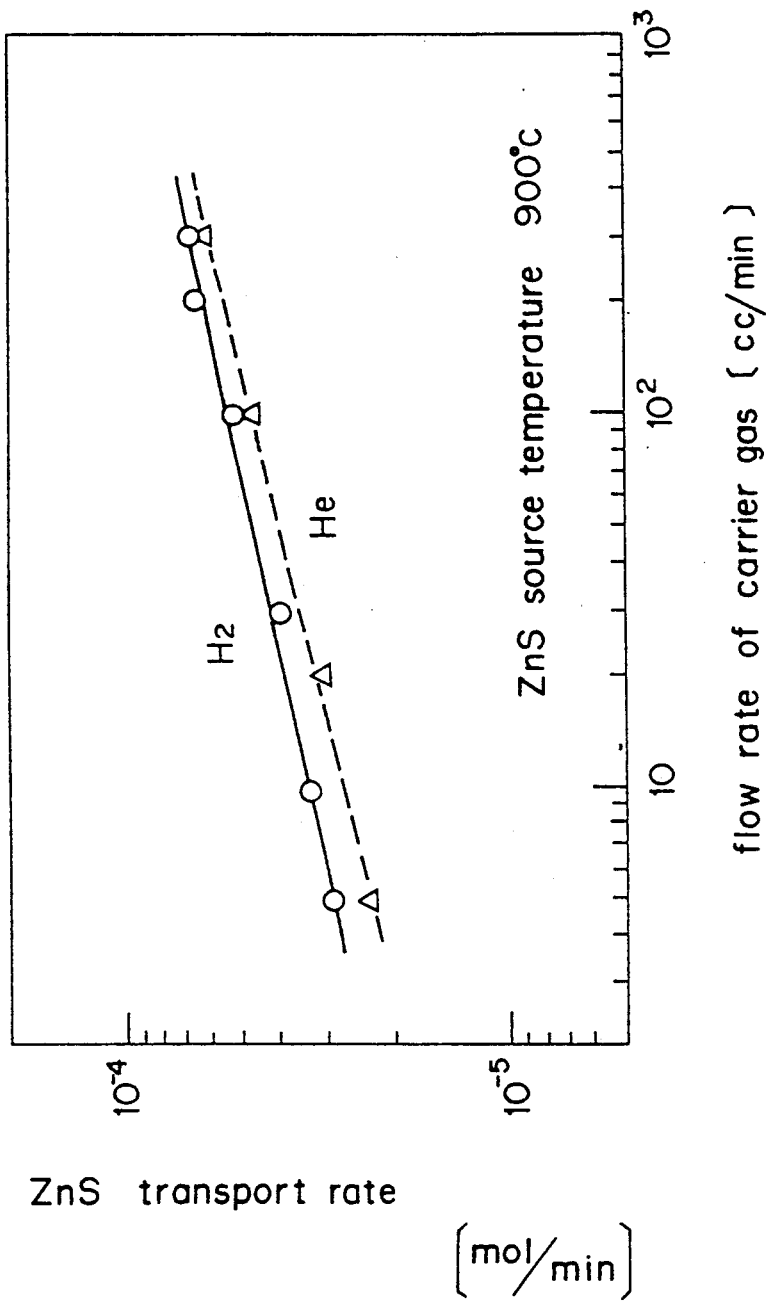
FIG. 1 is a graph of the dependence of ZnS source transport rate on the carrier gas flow rate.

As mentioned below, it is found preferable to suppress the generation of $H_2S$ gas. FIG. 1 shows the dependence of the ZnS source transport rate on the carrier gas flow rate when the carrier gases are made of $H_2$ and of He, respectively. The source transport rate increases in proportion with the ¼ to 1/5 power of the carrier gas flow rate in each case, and the transport rate with use of $H_2$ gas is about 20% larger than the value with the use of He gas. Here, when the constituents of the gas transported to the downstream side from the source zone are measured by a quadrupole mass spectrometer, 10 to 20% of $H_2S$ is detected in the case where the carrier gas is $H_2$ gas (it is not detected naturally when the carrier gas is He). This indicates that the transport mechanism of ZnS is limited to the reaction of the above-mentioned formula (1) when He carrier gas is used, $$ZnS \rightarrow Zn + (\tfrac{1}{2})S_2, \qquad (1)$$

while in the case of $H_2$ gas, the reaction represented by the following formula (3) takes place slightly:

$$ZnS + H_2 \rightarrow Zn + H_2S. \qquad (3)$$

Furthermore, when components in a film deposited on the reaction tube wall are examined, it is observed that in the case of $H_2$ gas, metal Mn is deposited in the gas mixing zone (a zone between the source zone and the growth zone) in which $H_2S$ and $MnCl_2$ transported from the source zone make contact to each other first. This shows that $MnCl_2$ is reduced by $H_2S$ owing to the following formula:

$$MnCl_2 + H_2S \rightarrow Mn + 2HCl + (\tfrac{1}{2})S_2, \qquad (4)$$

and as a result, the total amount of $MnCl_2$ is decreased during the transport. This is considered to be a cause for decreasing the Mn concentration and for deteriorating the reproducibility thereof in the case of $H_2$ gas.

Furthermore, it is found preferable to improve the reduction of $MnCl_2$ in the growth zone. Table 1 also shows the concentration ratio of Cl to Mn in an electroluminescent thin film. (The Cl concentration is measured with the fluorescent X-ray analysis and it is expressed as a relative value). As is apparent from this data, in the case where the carrier gas is an inert gas such as He or Ar, the amount of Cl taken into the film is larger than in the case of $H_2$ carrier gas. This is understood that when the carrier gas is $H_2$ gas, $MnCl_2$ transported onto the substrate and attached thereto is reduced by $H_2$ gas (the reverse reaction of the above-mentioned chemical reaction formula (2)), and Mn finally produced is taken into a ZnS film, whereas in the case of He or Ar gas, the above-mentioned reaction hardly takes place so that a larger amount of Cl ions are taken into an electroluminescent film. This is considered to be a cause for lowering the crystallinity in the case of an inert gas.

According to the results of the experiments and the analyses described above, it is found preferable to suppress the generation of H$_2$S gas in the source zone and to facilitate the reduction of MnCl$_2$ in the growth zone in order to accomplish doping of Mn of a higher concentration and to obtain better crystallinity. Therefore, an inert gas is employed as the carrier gas so as not to cause the reaction shown in the formula (2), and a (third) gas passage for feeding the gas is provided by bypassing the source zone from the upstream side of the reaction tube to the downstream side, and a reducing gas is supplied to the growth zone through the third gas passage. In this arrangement, the generation of H$_2$S gas is suppressed by the use of the inert gas, and the total amount of MnCl$_2$ is maintained during the transport. Therefore, the doping rate and the reproducibility of Mn concentration are improved. Furthermore, the partial pressure of the reducing gas is increased in the low temperature growth zone G, which results in the suppression of inclusion of impurities. Therefore, the crystallinity of a grown film is improved.

A manufacturing method of an electroluminescent thin film according to an embodiment of the present invention will be described below in detail.

Figure 2:
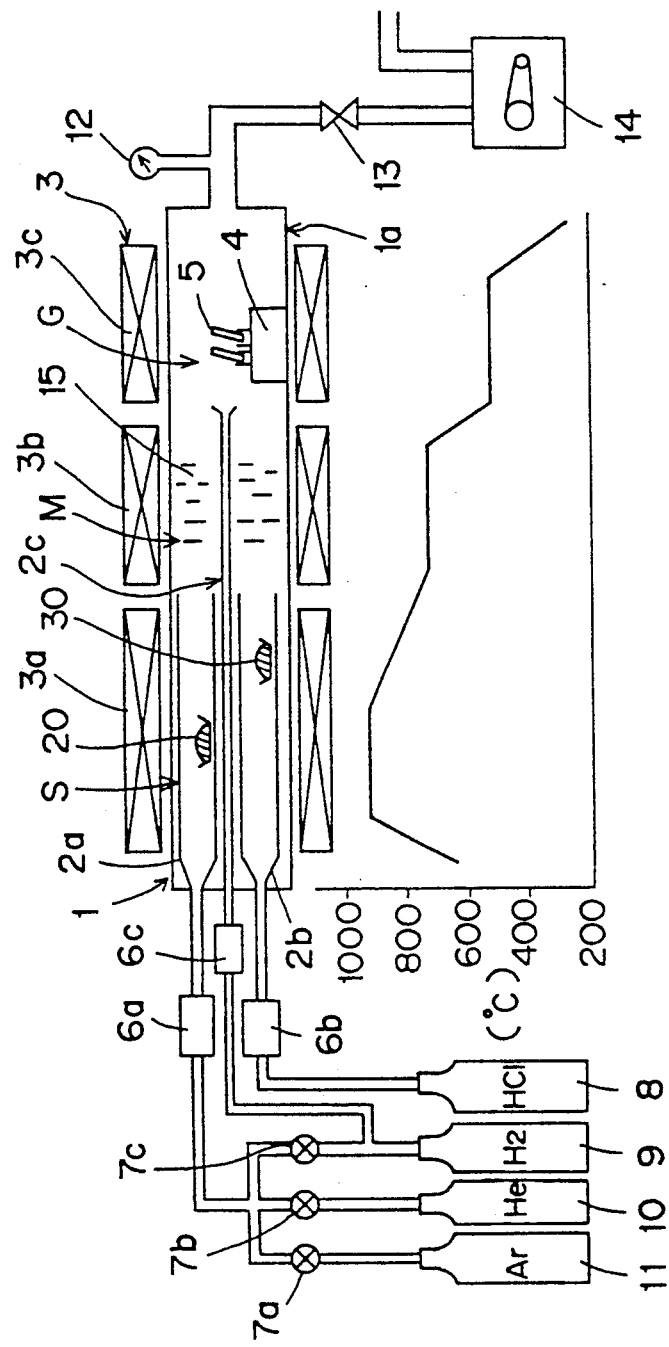
FIG. 2 is a schematic drawing showing a construction of a halogen transport CVD apparatus to be employed for a manufacturing method of electroluminescent thin film according to an embodiment of the present invention.

FIG. 2 shows a structure of a halogen transport CVD apparatus at a low pressure. The apparatus includes a reaction tube 1, a three-zone electric furnace 3 accommodating the reaction tube 1, a HCl gas bomb 8, a H$_2$ gas bomb 9, a He gas bomb 10 and an Ar gas bomb 11 for supplying raw materials, and an oil rotary pump 14 for evacuating the reaction tube 1. Further, the halogen transport CVD apparatus includes mass flow controllers 6a, 6b and 6c, a pressure gauge 12 for the reaction tube 1, and valves 7a, 7b, 7c and 13.

The reaction tube 1 is divided, from the upstream side, into three zones: a source zone S, a gas mixing zone M and a growth zone G. The temperatures of the zones S, M, G are controlled independently with heaters 3a, 3b and 3c of the electric furnace 3, respectively.

The reaction tube 1 has first and second raw material supplying tubes 2a and 2b of 50 cm length and 2 cm inner diameter as first and second gas passages in the source zone S within a quartz glass tube 1a of 1 m length and of 5 cm inner diameter. In the supplying tubes 2a and 2b, ZnS powder 20 and metallic Mn 30 are placed in quartz boats. H$_2$ gas, He gas or Ar gas to be supplied is selected by the valves 7a, 7b and 7c and the selected gas is fed through the mass flow controller 6a to the first supplying tube 2a, while HCl gas is fed through the mass flow controller 6b to the second supplying tube 2b. The gas mixing zone M is provided with gas mixing baffles 15 for mixing the gases supplied through the supplying tubes 2a and 2b from the source zone S.

Furthermore, the reaction tube 1 has a third gas passage made of a narrow supplying narrow supplying tube 2c of 5 mm inner diameter, and the tube 2c extends from the source zone S to a boundary between the gas mixing zone M and the growth zone G. The growth zone G is provided with a substrate holder 4 for holding substrates 5. H$_2$ gas is supplied through the mass flow controller 6c to the narrow tube 2c to supply H$_2$ gas directly onto the substrates 5 disposed in the growth zone G (onto the substrate holder 4), bypassing the source zone S and the gas mixing zone M.

In growing an electroluminescent thin film of ZnS/Mn, a substrate 5 is prepared beforehand by layering successively an indium tin oxide transparent thin film, a SiO$_2$ film and a Si$_3$N$_4$ film on a glass substrate. Then, temperature profiles of respective zones S, M and G are set by the heaters 3a, 3b and 3c, as shown in an inset in FIG. 2. That is, the temperatures at the three zones S, M and G are 900°, 700° and 500° C., respectively. The growth time is adjusted so that the thickness of a grown film is 0.8 μm. Meanwhile, the ZnS source 20 is transported through the first supplying tube 2a by using He gas of 100 cc/min flow rate as the carrier gas, while the Mn source 30 is transported through the second supplying tube 2b in the form of MnCl$_2$ vapor by using HCl carrier gas of 0.5 cc/min flow rate. Thin films are grown under various conditions of the flow rate $F_{H2}$ of H$_2$ gas supplied through the narrow supply tube 2c in the range of 0 to 100 cc/min. Thereafter, in order to evaluate the grown ZnS:Mn thin films, a Si$_3$N$_4$ film, an Al$_2$O$_3$ film and Al electrodes are formed on the substrates 5, to form electroluminescent thin films.

Figure 3:
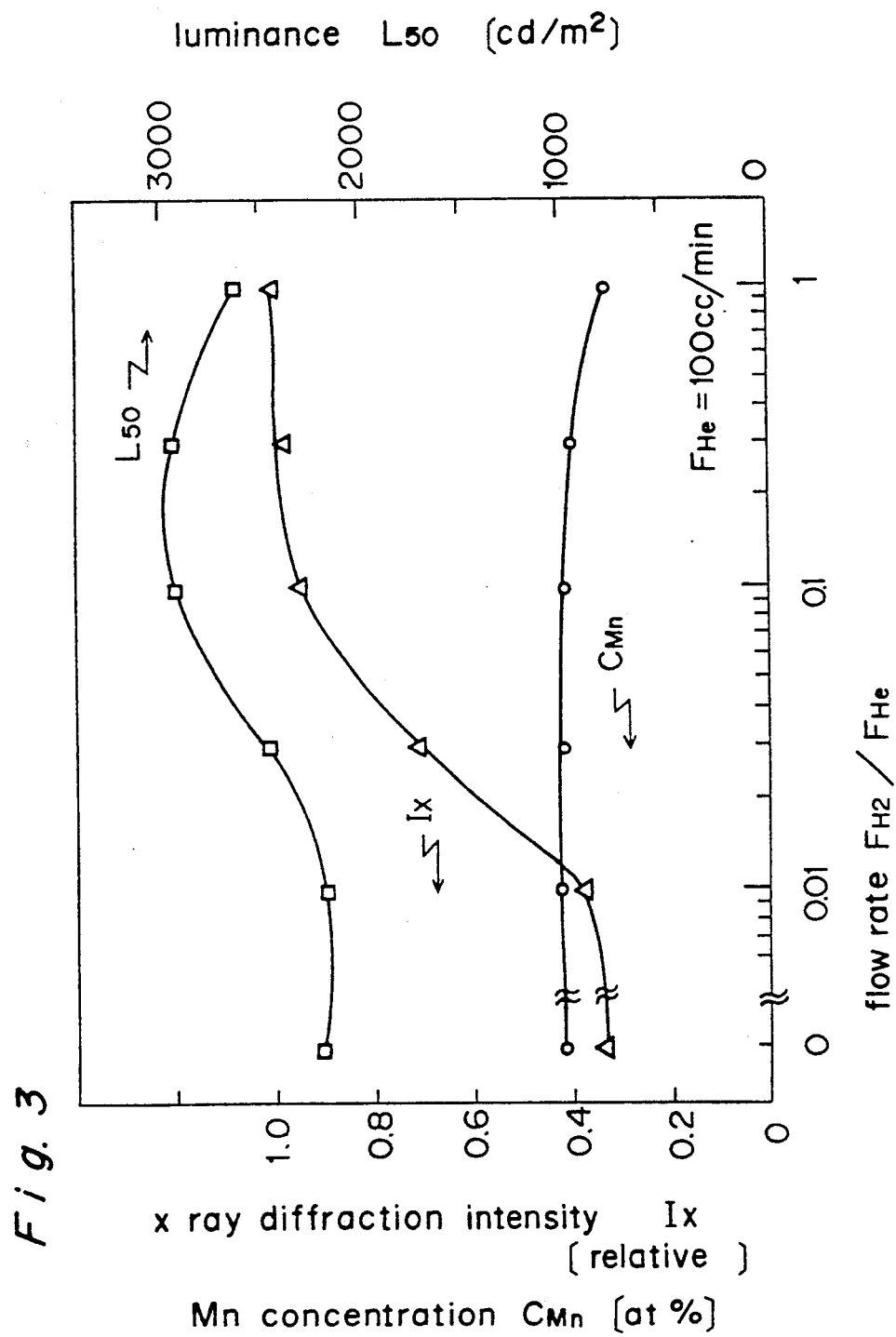
FIG. 3 is a graph showing the variations of Mn concentration, X-ray diffraction intensity and light emitting luminance according to the flow rate of bypassed $H_2$ gas.

FIG. 3 shows data on the Mn concentration $C_{Mn}$ and X-ray diffraction intensity $I_X$ in ZnS:Mn films grown by the above-described process and on the luminance $L_{50}$ which is important for a thin film electroluminescent element. In FIG. 3, the flow rate $F_{H2}$ is represented as a flow rate ratio $F_{H2}/F_{He}$ relative to the flow rate $F_{He}$ of He gas.

The data in FIG. 3 shows that (1) although the Mn concentration $C_{Mn}$ decreases to some extent with an increase in the flow rate ratio $F_{H2}/F_{He}$, the flow rate ratio dependence of the Mn concentration is small and the addition of H$_2$ gas does not lower the Mn concentration largely. In other words, by bypassing H$_2$ gas, emission center can be doped at a concentration approximately as high as in the case where an inert gas such as He or Ar is used as carrier gas for the ZnS source 20. At the same time, the reproducibility of Mn concentration can be improved.

(2) Furthermore, the X-ray diffraction intensity $I_X$ (namely, crystallinity) tends to be improved by introducing a small amount of H$_2$, and it monotonously increases as the flow rate of H$_2$ gas increases until it saturates at 0.1 or more of the flow rate ratio $F_{H2}/F_{He}$. In other words, by raising the partial pressure of H$_2$ gas in the growth zone G, the crystallinity can be improved.

(3) Luminance $L_{50}$ is improved in correspondence to the improvement of the crystallinity. However, when the ratio $F_{H2}/F_{He}$ is 0.01 or less, the luminance becomes to be of the same level as in the case where an inert gas is independently used as the carrier gas, while no effect is observed when the ratio $F_{H2}/F_{He}$ is one or more.

From the results of the above-mentioned points (1), (2) and (3), it is effective to set the flow rate of the bypassed H$_2$ gas in the following range:

$$0.01 < F_{H2}/F_{He} < 1.$$

In the case of such a setting, Mn can be doped at a high concentration in a grown film, and the crystallinity can be made to be of a good level. Furthermore, the luminance of a thin film electroluminescent element can be increased.

It is found that the temperature range is preferably to be from 700° to 1000° C. in the source zone S, from 400° to 600° C. in the growth zone G and from 600° to 700° C. in the gas mixing zone M. This will be explained in detail below.

Figure 4:
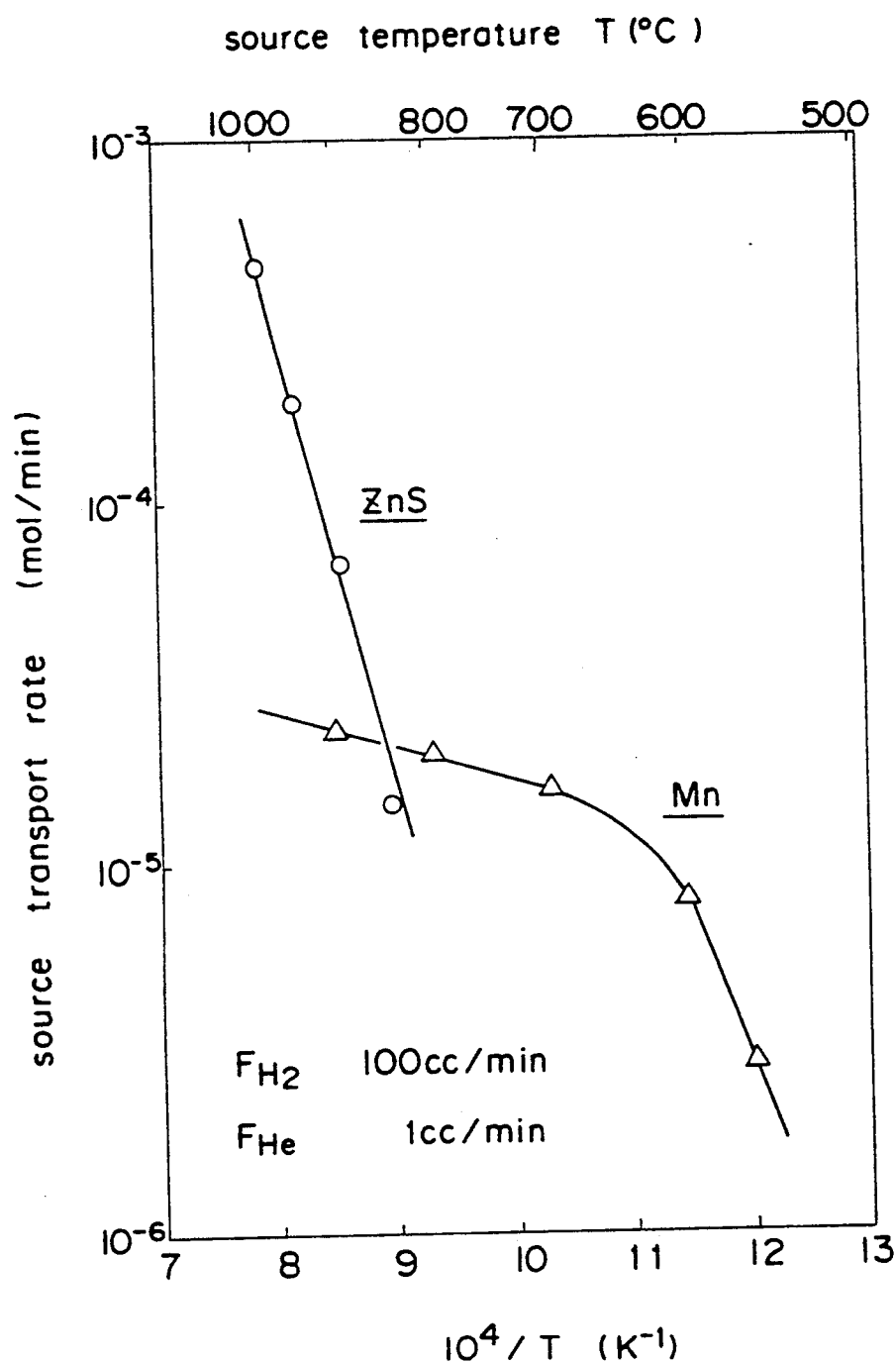
FIG. 4 is a graph of the source transport rate of ZnS and Mn plotted against source temperature.

FIG. 4 displays the transport rates of the sources, ZnS and Mn, which increase with increasing temperatures. The temperature in the source zone S is required to be high enough to transport the source materials ZnS and Mn at a sufficient transport rate. It is preferable that the transport rate of ZnS is $10^{-4}$ mol/min or more, while the transport rate of Mn is $10^{-5}$ mol/min or more lower than that of ZnS because Mn is a dopant. A thin film of thickness of about 0.6 μm or more is needed for an electroluminescent film, while the reaction time for growing a film of 0.6 μm is needed to be as short as about one hour or less from the viewpoint of productivity. Then, the growth rate of film is needed to be 100 Å/min or more, which corresponds to $10^{-4}$ mol/min or more. Then, it is preferable that the source temperature of ZnS is as high as 900° C. or more while that of Mn is as high as 700° C. or more. The upper limit is determined by the rating temperature of quartz of the reaction tube 1. Therefore, the temperature range of the source zone S is preferably 700° to 1000° C.

The temperature of the gas mixing zone M is required to be higher than the temperature of the growth zone G in order to prevent the solidification of the transported sources. On the other hand, the upper limit of the temperature is determined so as to prevent the deterioration of the reaction tube 1 according to the reaction of quartz with Mn, and the upper limit is set to be as high as the Mn source temperature or less. Then, the temperature range of the gas mixing zone M is preferably between the source temperature and the growth temperature or between 600° and 700° C.

Figure 5:
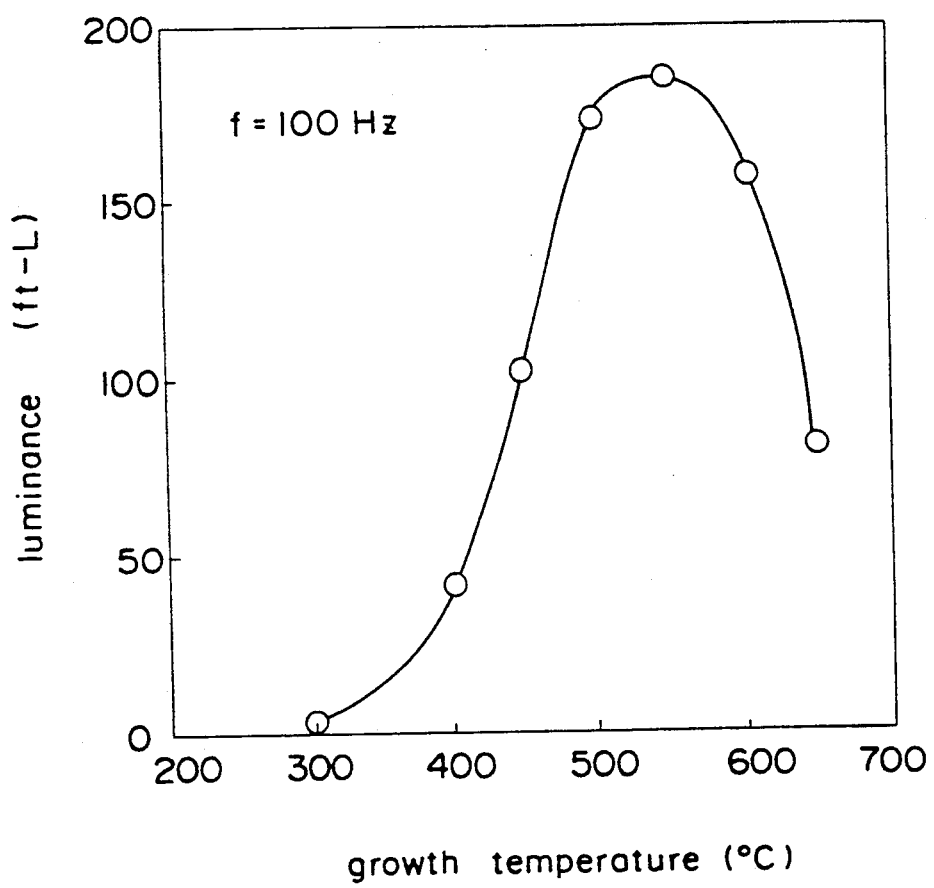
FIG. 5 is a graph of luminance plotted against growth temperature.

FIG. 5 shows the relation of the luminance of an electroluminescent film against the temperature of the growth zone G. The luminance is required to be 100 ft-L or more for an electroluminescent display of a size from nine to ten inches while it is required to be about 50 ft-L for an electroluminescent display of a size from five to six inches. Then, the lower limit of the growth temperature G is 400° C. The upper limit is determined by the softening point of a substrate. Therefore, the temperature range of the growth zone G is preferably between 400° C. to the softening point. If a glass substrate is used, a temperature as high as 650° C. as shown in FIG. 5 cannot be used because the softening point of the glass substrate is lower than 650° C., and the temperature range of the growth zone G is 400°-600° C.

In the above-mentioned embodiment, ZnS crystals of wurtzite structure are obtained. If the amount of transported Mn is restricted to zero, ZnS crystals of a zincblende structure are obtained. However, if Mn of an amount necessary for electroluminence is doped, only ZnS crystals of a wurtzite structure are obtained. Further, the grain-size of ZnS crystals of a wurtzite structure is larger than that of zincblende structure, and the alignment of crystal grains in a film is better in crystals of a wurtzite structure than in crystals of a zincblende structure.

The embodiment mentioned above relates to the growth of ZnS:Mn films which have already been used practically as an electroluminescent element. However, needless to say, the present invention is not limited to this embodiment. With respect to II-VI group compound semiconductors such as ZnSe, CaS and SrS as base materials other than ZnS, the chemical reactions corresponding to the formulas (1) and (3) take place, and with respect to rare earth group ions such as Tb as emission center material other than Mn, the chemical reactions corresponding to the formulas (2) and (4) take place. Therefore, the present invention is advantageously and widely applicable to the growth of electroluminescent thin films other than ZnS:Mn thin films.

Furthermore, nitrogen ($N_2$), argon (Ar), or neon (Ne) is also usable besides He as an inert gas, and $H_2S$ or ammonia ($NH_3$) is usable as a reducing gas besides $H_2$.

As is clear from the foregoing description, an electroluminescent thin film of a high quality can be manufactured with good reproducibility characteristics.

Furthermore, in the case where the inert gas and the reducing gas are made of He gas and $H_2$ gas, respectively, and the ratio of respective gas flow rates $F_{He}$ and $F_{H2}$ satisfies the following relation:

$$0.01 < F_{H2}/F_{He} < 1,$$

a high quality electroluminescent thin film can be formed with good reproducibility characteristics and the luminance of a thin film electroluminescent element can be improved.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A manufacturing method of an electroluminescent thin film, comprising the steps of:
   (a) providing first and second gas passages in a source zone located on the upstream side in a reaction tube, and providing a base material made of a group II-VI compound semiconductor in said first gas passage and providing a material made of an element comprising manganese or rare earth ions in said second gas passage, said element playing a role as an emission center in said base material;
   (b) providing a third gas passage to bypass said source zone from the upstream side to the downstream side of said reaction tube;
   (c) transporting said base material through said first gas passage to a growth zone located on the downstream side in said reaction tube with the use of a carrier gas, said carrier gas being made of an inert gas, and transporting said element material in the form of halogen compound vapor through said second gas passage to the growth zone;
   (d) feeding a reducing gas to said growth zone through said third gas passage to reduce said halogen compound; and
   (e) growing an electroluminescent thin film on a substrate provided in said growth zone.

2. A method according to claim 1, wherein a gas mixing zone is provided between said source zone and said growth zone, the gases supplied from said first and second gas passages are mixed in the gas mixing zone, and said third gas passage bypasses the gas mixing zone.

3. A method according to claim 1, wherein said base material comprises a group II-VI compound semiconductor and said element comprises manganese or a rare earth.

4. A method according to claim 3, wherein said base material comprises zinc sulfide and said element comprises manganese.

5. A method according to claim 1, wherein said reducing gas comprises hydrogen.

6. A method according to claim 1, wherein said inert gas and said reducing gas are made of He gas and $H_2$ gas, respectively, and the ratio of the gas flow rate $F_{He}$ of the He gas to the gas flow rate $F_{H2}$ of the $H_2$ gas satisfies the following relation:

$$0.01 < F_{H2}/F_{He} < 1.$$

7. A method according to claim 4, wherein the temperature source zone is set between 700° and 1000° C. in the and the temperature in the growth zone is set between 400° and 600° C.

* * * * *